United States Patent [19]
Huggins et al.

[11] Patent Number: 5,910,922
[45] Date of Patent: Jun. 8, 1999

[54] METHOD FOR TESTING DATA RETENTION IN A STATIC RANDOM ACCESS MEMORY USING ISOLATED $V_{CC}$ SUPPLY

[75] Inventors: Alan H. Huggins, Gilroy; William L. Devanney, Menlo Park; Chuen-Der Lien, Los Altos Hills, all of Calif.

[73] Assignee: Integrated Device Technology, Inc., Santa Clara, Calif.

[21] Appl. No.: 08/906,448

[22] Filed: Aug. 5, 1997

[51] Int. Cl.[6] ............................................... G11C 7/00
[52] U.S. Cl. ................................. 365/201; 365/226
[58] Field of Search .................... 365/201, 226, 365/230.06

[56] References Cited

U.S. PATENT DOCUMENTS

| | | | |
|---|---|---|---|
| 5,109,382 | 4/1992 | Fukunaka | 371/21.1 |
| 5,155,701 | 10/1992 | Komori et al. | 365/201 |
| 5,241,501 | 8/1993 | Tanaka | 365/201 |
| 5,255,230 | 10/1993 | Chan et al. | 365/201 |
| 5,258,954 | 11/1993 | Furuyama | 365/201 |
| 5,276,647 | 1/1994 | Matsui et al. | 365/201 |
| 5,373,509 | 12/1994 | Katsura | 371/21.2 |
| 5,375,247 | 12/1994 | Hueser | 395/750 |
| 5,377,148 | 12/1994 | Rajsuman | 365/201 |
| 5,392,248 | 2/1995 | Truong et al. | 365/201 |
| 5,400,281 | 3/1995 | Morigami | 365/201 |
| 5,483,488 | 1/1996 | Sanada | 365/189.03 |
| 5,513,142 | 4/1996 | Arimoto et al. | 365/230.06 |
| 5,604,712 | 2/1997 | Priebe | 365/230.06 |
| 5,696,731 | 12/1997 | Miyamoto | 365/230.06 |

Primary Examiner—Son T. Dinh
Attorney, Agent, or Firm—Skjerven, Morrill, MacPherson, Franklin & Friel

[57] ABSTRACT

A circuit and a method for providing a power supply voltage to a memory circuit during a memory data retention test are provided. In such a circuit, a first power supply terminal and a second power supply terminal are provided together with a plurality of circuit elements, which are coupled to form a current path between the first and second power supply terminals, such that each circuit element contributes a predetermined voltage drop between the first and second power supply terminals when a current flows in said current path. In addition, a shunt device having a control terminal and coupled across one or more of said circuit elements is provided. The control terminal receives a control signal, such that when the control signal is asserted, the shunt device equalizes a voltage across said one or more of said circuit elements. The memory circuit draws its power supply voltage from the second power supply terminal.

10 Claims, 4 Drawing Sheets

METHOD FOR TESTING DATA RETENTION IN A STATIC RANDOM ACCESS MEMORY USING ISOLATED V$_{CC}$ SUPPLY

BACKGROUND OF THE INVENTION

1. Field of the Invention

The present invention relates to methods of testing an integrated circuit. In particular, the present invention relates to methods of testing memory elements in an integrated circuit.

2. Discussion of the Related Art

In an integrated circuit, it is advantageous for a memory element, such as a static random access memory (SRAM) device, to retain its stored data during a momentary dip in power supply voltage. The "V$_{dr}$" (data retention voltage) test is devised to test such data retention capability. Under the V$_{dr}$ test, data is first written into the memory element. Then, the power supply voltage (V$_{cc}$) is lowered momentarily (e.g. for one second) to a value below that voltage at which data is written into the memory element (e.g., 0.6 volts), before returning the power supply voltage to the normal operating supply voltage (e.g. 4 volts). The memory element is then read to determine if the stored data is retained.

However, there are two mechanisms by which a memory element may lose its stored data. These mechanisms are illustrated by FIG. 1. FIG. 1 shows, in the prior art, an SRAM cell 100 sharing a power supply bus 109 with a logic circuit 150. As shown in FIG. 1, an SRAM cell 100 includes load devices 101 and 102, N-type transistors 107 and 108, and transfer transistors 103 and 104. Transfer transistors 103 and 104, which are part of a "word line", are controlled by the same control signal A at their respective gate terminals 107 and 108. Load devices 101 and 102 can be MOS transistors, thin-film transistors, or polysilicon resistors. During a read access, the control signal A is asserted at terminals 107 and 108 of transfer transistors 103 and 104 to allow the datum stored in SRAM cell 100 be read as complementary signals B and $\overline{B}$ at terminals 106 and 105 respectively. During a write access, control signal A is asserted at terminals 107 and 108 of transfer transistors 103 and 104 to allow the datum represented by the complementary signals B and $\overline{B}$ at terminals 106 and 105, respectively, to be stored into SRAM cell 100. As shown in FIG. 1, SRAM cell 100 and logic circuit 150 receive a common power supply voltage from power supply bus 109. In addition, control signal A is an output signal of logic circuit 150.

During the V$_{dr}$ test, SRAM cell 100 may lose its stored data if the low power supply voltage at power supply bus 109 causes the voltages of terminals 110 and 111 to fall below the requisite gate-to-source voltage necessary to turn on either one of transistors 107 and 108. Alternatively, the data in SRAM cell 100 may also be over-written if the low supply voltage causes unintended switching in logic circuit 150, such that control signal A is unintentionally asserted, resulting in an unintended write operation into SRAM cell 100. This unintended write operation may be triggered, for example, because logic circuit 150 is designed to operate only at the limited supply voltage range of 4–6 volts and some portions of logic circuit 150 are designed to have a "trip-point", i.e. the threshold value between logic states, above V$_{dr}$. For example, depending on both the inductance and the current in supply voltage bus 109 (i.e. V$_{cc}$) overshooting or undershooting during signal transmission can result in memory content loss. Hence, in the prior art, a V$_{dr}$ test in a central processing unit (CPU) that requires lowering the supply voltage below 1.5 volts, is virtually impossible because of the likelihood that false signal transitions, such as those discussed above, can trigger unintended write operations which affect data in the memory cells. The momentary dip in power supply voltage under the V$_{dr}$ test can lead to not only data corruption, but also masking of a true data retention problem. Such masking occurs when the data lost is replaced correctly, albeit fortuitously, by an unintended write operation of the type discussed above.

SUMMARY OF THE INVENTION

The present invention provides, in an integrated circuit which includes a logic circuit and a memory circuit, a circuit for applying a data retention test to the memory circuit. According to the present invention, the circuit for applying the data retention test includes: (i) a first power supply terminal; (ii) a second power supply terminal for providing a power supply voltage to the memory circuit; (iii) a number of circuit elements coupled to form a current path between the first and second power supply terminals, each circuit element contributing a predetermined voltage drop when a current flows in the current path; and (iv) a shunt device coupled across one or more of the circuit elements, the shunt device receiving a control signal such that, when the control signal is asserted, the shunt device equalizes a voltage across that one or more of the circuit elements.

In according to another aspect of the present invention, a logic circuit of the present invention includes: (i) a first power supply terminal coupled to provide power to the memory circuit; (ii) a second power supply terminal couple to receive a power supply voltage external to the integrated circuit; (iii) an NMOS transistor having its source and drain terminals coupled between the first and second power supply terminals, and its gate terminal biased such that the transistor is conducting; and (iv) a PMOS transistor receiving at its gate terminal a control signal, and having its drain and source terminals coupled across the NMOS transistor, such that when the control signal is in an asserted state, the PMOS transistor conducts so as to equalize a voltage across the NMOS transistor.

In one embodiment, the logic circuit of the present invention further includes a second NMOS transistor coupled between the first and second power supply terminals and in series with the first NMOS transistor, and a second PMOS transistor receiving at its gate terminal a second control signal, and having its source and drain terminals coupled between the first and second power supply terminals, such that when the second control signal is asserted, the second PMOS transistor becomes conducting so as to equalize a voltage across the series-connected first and second NMOS transistors.

The present invention prevents unintended logic transitions in the logic circuit from interfering with the data retention test. The present invention is particularly applicable to static random access memory (SRAM) circuits. To achieve isolation of word lines of a memory circuit during a data retention test, the present invention provides: (i) a plurality of signal drivers, each signal driver driving one of the word lines, each signal driver receiving a control signal at a control terminal of the signal driver such that, when the control signal is asserted, the signal drivers are tristated; and (ii) a transistor controlled by an input signal, the transistor being coupled between a power supply voltage and coupled commonly to the control terminals of the signal drivers, such that when the input signal is in an asserted state, the transistor becomes conducting thereby asserting the control signal to isolate each and every one of the word lines.

The present invention is better understood upon consideration of the detailed description below and the accompanying drawings.

BRIEF DESCRIPTION OF THE DRAWINGS

FIG. 2c shows power supply buses 283, 284 and 285 of memory elements 280, 281 and 282 of integrated circuit 275 coupled through a control circuit 278 to a pad receiving an external power supply signal at terminal 276.

FIG. 3b shows that, by providing different resistances for resistive devices 303a, 303b and 303c, different $V_{dr}$ (i.e. data retention voltage) can be achieved by selectively enabling switching devices 304a, 304b and 304c, in accordance with the principles illustrated by FIG. 3a.

FIG. 4a shows an alternative embodiment 400 of the present invention using the principles of operation illustrated in FIG. 3a; in FIG. 4a, instead of resistive devices 306 and 303 of FIG. 3a, a constant current source 401 and a switching device 402 are provided.

DETAILED DESCRIPTION OF THE PREFERRED EMBODIMENTS

Although this present invention is illustrated by way of example in this detailed description using a static random access memory (SRAM) cell, it will be appreciated that the present invention is applicable generally to the testing of any memory element in an integrated circuit. At present, SRAM cells can be found in either a conventional memory integrated circuit, or an "embedded" configuration (e.g. an SRAM array in a microprocessor, or any SRAM cell embedded in a logic circuit). Such SRAM cells can be formed, for example, in a P-type region (e.g. a P-well) of the silicon surface.

Figure 2A:
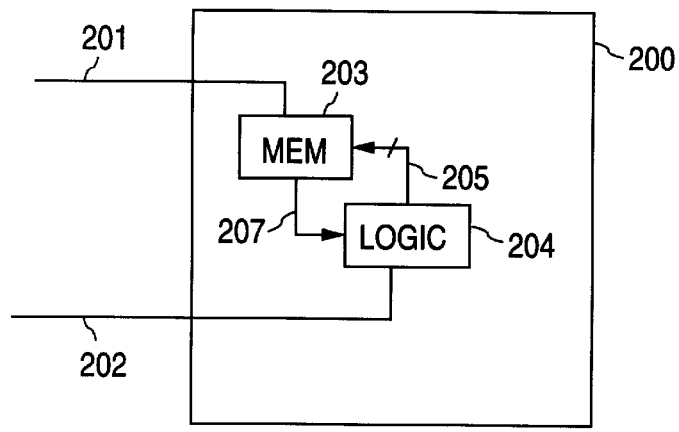
FIG. 2a shows an integrated circuit 200 in which memory elements 203 are supplied by power supply bus 201, received separately from power supply bus 202, which powers logic circuit 204.

The present invention allows the memory elements such as an SRAM array, to be powered down independently of a central processing unit (CPU) or any logic circuit coupled to the memory elements. Thus, in one embodiment, the $V_{cc}$ power supply for memory devices in the integrated circuit and the $V_{cc}$ power supply of the logic circuits in the same integrated circuit are received into the integrated circuit as separate power supply signals which are not coupled each other within the integrated circuit. FIG. 2a shows an integrated circuit 200 in which memory elements 203 are supplied by power supply bus 201, received separately from power supply bus 202, which powers logic circuit 204. Input signals 205 and output signals 207 of memory elements 203 represent, respectively, control signals 205 coupled from logic circuit 204 to control the operation of memory circuit 203. Output data from memory elements 203 are coupled to logic circuit 204 on bus 207. Under the configuration of FIG. 2a, the $V_{dr}$ test can be carried out by lowering the voltage in power supply bus 201, without changing the voltage on power supply bus 202. Thus, the $V_{dr}$ test of memory elements 203 can be conducted free of unintended write operations initiated by logic circuit 204, or any interference from logic circuit 204. In this embodiment, the control circuit of memory circuit 203, e.g. bit-line or word-line drivers, may be provided within memory circuit 203, which receives power from supply bus 201. Alternatively, these control circuits can also be included into logic circuit 204. By including these control circuits, the memory cells or memory cell arrays can be tested independently from the control circuits.

Figure 2B:
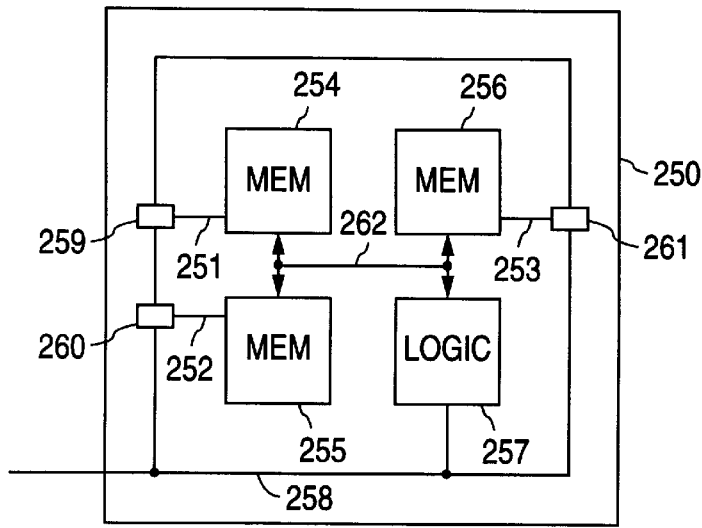
FIG. 2b shows, in integrated circuit 250, logic circuit 257 and memory elements 254, 255 and 256 being supplied by power supply buses 258, 251, 252 and 253 respectively.

Alternatively, individually isolatable $V_{cc}$ rails can be provided to supply different blocks of memory cells. FIG. 2b shows, in integrated circuit 250, logic circuit 257 and memory elements 254, 255 and 256 being supplied by power supply buses 258, 251, 252 and 253 respectively. In FIG. 2b, power supply switching circuits 259, 260 and 261 are provided to regulate the voltages in power supply buses 251, 252 and 253 respectively. Control and data signals routed among logic circuit 257 and memory elements 254, 255 and 256 are represented by signal bus 262. Power supply switching circuits 259, 260 and 261 are discussed in further detail below. Because the voltages in power buses 251, 252 and 253 can each be regulated individually, $V_{dr}$ tests can be carried out for memory elements 254, 255 and 256 independently.

Of course, variations from the schemes shown in FIGS. 2a and 2b are possible. For example, in FIG. 2c, the power supply buses 283, 284 and 285 in memory elements 280, 281 and 282 of integrated circuit 275 are coupled through a control circuit 278 to an additional input pad which receives an external power supply signal at terminal 276. Data and control signals among logic circuit 279, which is supplied by a separate power supply signal 277, control circuit 278, and memory elements 280, 281 and 282 are represented by data bus 286. Control circuit 278 includes power supply switching circuits, discussed below, which regulates power buses 283, 284 and 285 individually. In this configuration, $V_{dr}$ tests can be conducted individually for memory elements 280, 281 and 282 under logic circuit 279's control.

Figure 3A:
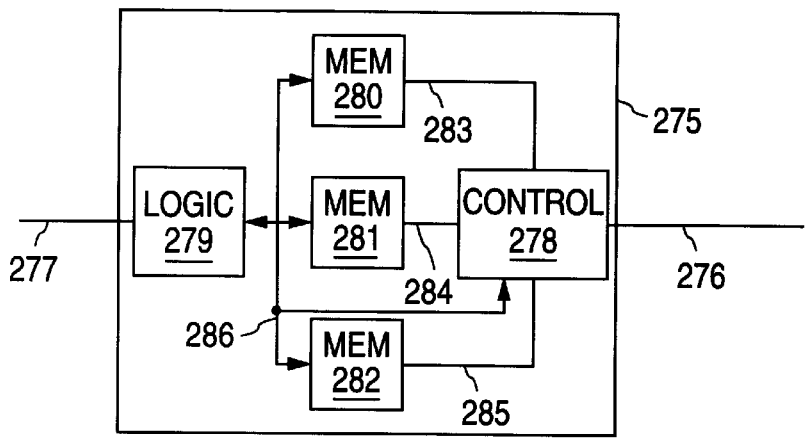
FIGS. 3a illustrates the principles of operation of a power switching circuit 300, which can be used to implement each of power switching circuits 251, 252, 253 and control circuit 278 above.
Figure 3A:
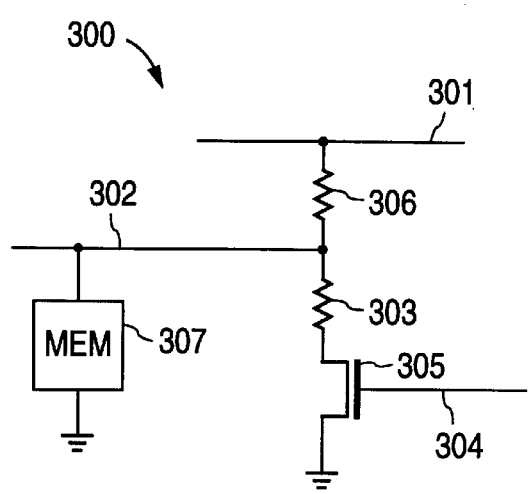

FIG. 3a illustrates the principles of operation of a power switching circuit 300 which can be used to implement power switching circuits 251, 252, 253 and control circuit 278 above. In FIG. 3a, a power switch 300 couples a power bus 301 to a power bus 302 through a resistive device 306 of on-resistance $R_1$. Using as example FIG. 2b, power switch 300 can be used to couple input power bus 261 to power bus 253, which supplies memory elements 256. In FIG. 3a, an additional resistive device 303 of on-resistance $R_2$ is coupled to ground voltage through a switching device 305 of on-resistance $R_3$. Switching device 305, which is controlled by a control signal at terminal 304, places the data retention test voltage $V_{dr}$ on power bus 302 during a $V_{dr}$ test. Switching device 305 can be provided by an NMOS transistor, for example. During a $V_{dr}$ test, switching device 305 conducts so that the voltage $V_{dr}$ in power bus 302 is given by:

$$V_{dr} = \frac{R_2 + R_3}{R_1 + R_2 + R_3} * V_{cc} = \frac{\frac{R_2}{R_1} + \frac{R_3}{R_1}}{1 + \frac{R_2}{R_1} + \frac{R_3}{R_1}} * V_{cc}$$

Figure 3B:
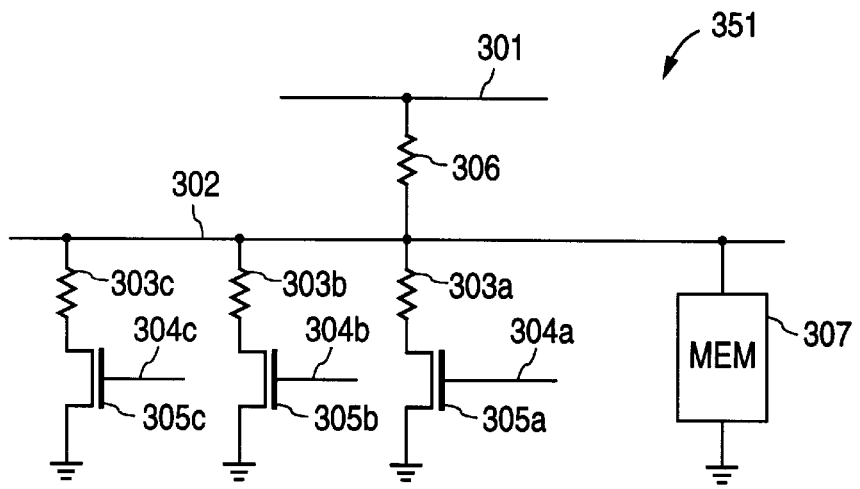

Because memory circuits typically draw relatively little current (e.g. average current of 0.5 milliamps, for a typical 256K SRAM array), the dissipation by resistive device 306 represents an insignificant load on the integrated circuit during normal circuit operation. Further, as can be seen by inspection from the above equation, if the resistance $R_3$ of switching device 305 is made small relative to resistance $R_1$ and $R_2$ of resistive devices 306 and 303, $V_{dr}$ in power supply bus 302 can be accurately provided using ratioed devices. In semiconductor circuit manufacturing, a very accurate resistance ratio can be achieved between two devices by sizing the two devices proportionally. FIG. 3b shows that, by providing different resistances for resistive devices 303a, 303b and 303c, different $V_{dr}$ can be achieved by selectively enabling switching devices 304a, 304b and 304c, in accordance with the principles illustrated by FIG. 3a. The control of switching devices 304a, 304b and 304c can be provided by the logic circuits which are powered by power supply bus 301, which is not subject to the $V_{dr}$ test.

Figure 4A:
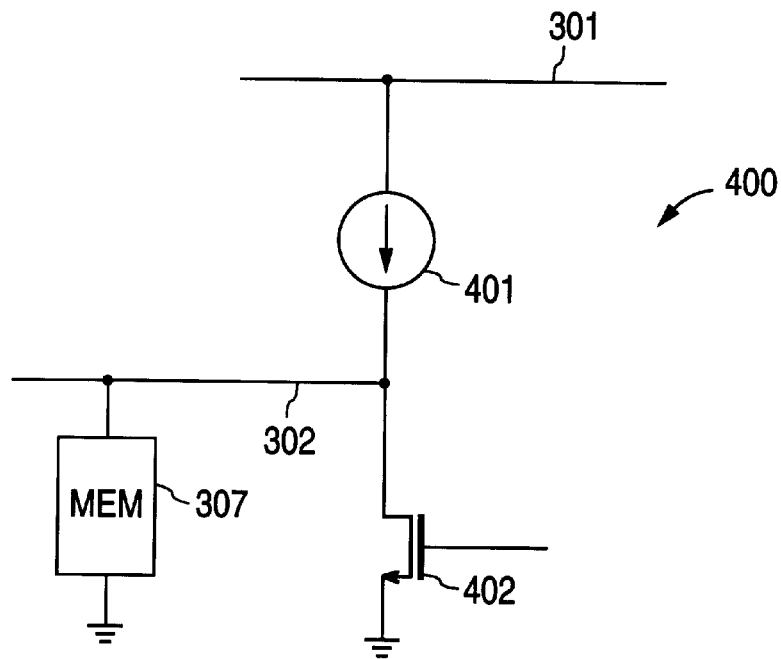

FIG. 4a shows an alternative embodiment 400 of the present invention using the principle discussed above. In FIG. 4a, in place of resistive devices 306 and 30 of FIG. 3a, a constant current source 401 and a switching device 402 are provided. In this instance, the data retention voltage $V_{dr}$ is obtained by the product of the current in current source 401 and the on-resistance of switching device 402. Current source 401 can be implemented by the well-known "current mirror" circuit 450 shown in FIG. 4c.

Figure 4B:
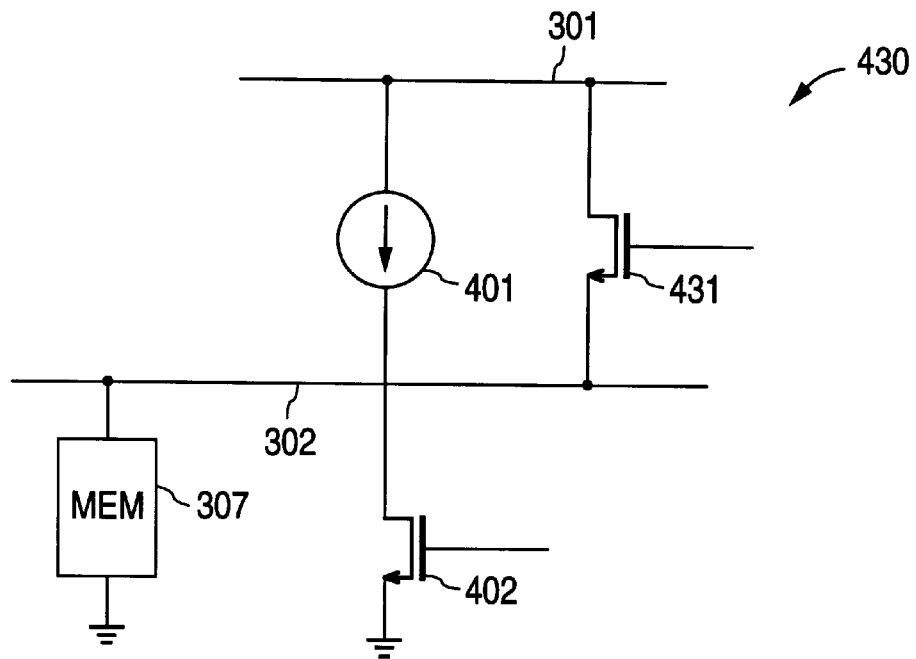
FIG. 4b shows a second alternative embodiment 430 of the present invention, in which a switching device 431 is provided as a low resistance shunt during normal operation.
Figure 4C:
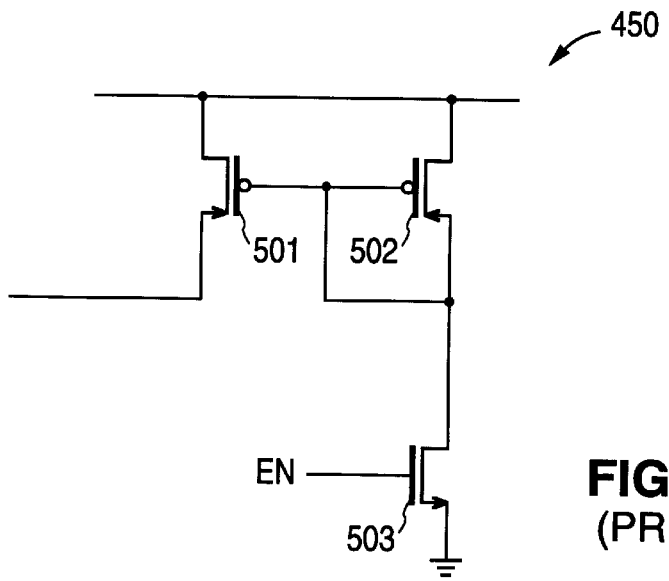
FIG. 4c is a schematic diagram of a current source which can be used to implement current source 401 of FIGS. 4a and 4b.

FIG. 4b shows a second alternative embodiment 430 of the present invention, in which a switching device 431 is provided as a low resistance shunt during normal operation. In FIG. 4b, an additional switching device 431 is provided to the circuit 400 of FIG. 4a. Switching device 431 can be a transistor of very low on-resistance. During normal operation, resistor 431 is turned on, and current source 401 is turned off, so that the voltage of power supply bus 302 can be kept as close as possible to the voltage on power supply bus 301. During a $V_{dr}$ test, current source 401 is turned on, switching device 431 is turned off, and switching device 402 is switched on. Like power switching circuit 400 of FIG. 4a, the data retention voltage $V_{dr}$ is provided by the product of the current in current source 401 and the on-resistance of switching device 402.

Figure 5:
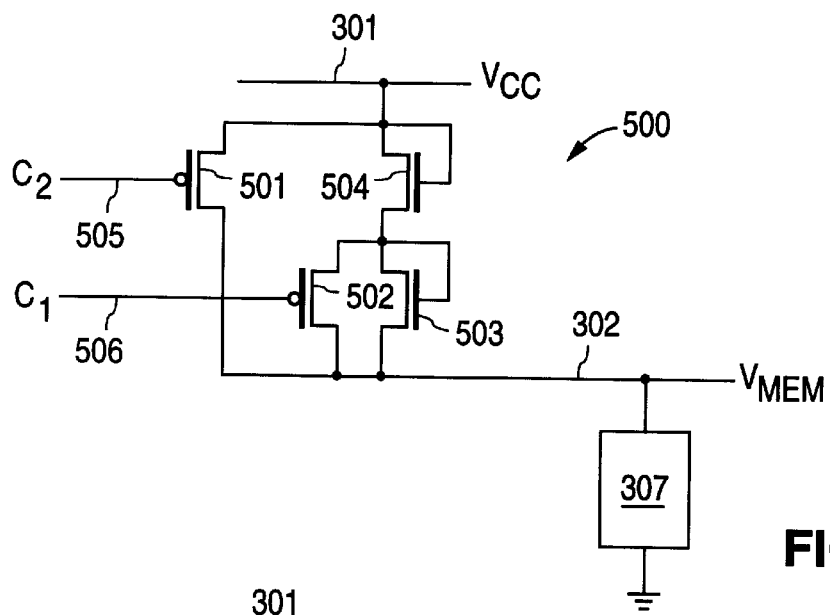
FIG. 5 shows another embodiment 500 of the present invention including PMOS transistors 501 and 502 and NMOS transistors 503 and 504.

FIG. 5 shows another embodiment 500 of the present invention. As shown in FIG. 5, circuit 500 includes PMOS transistors 501 and 502 and NMOS transistors 503 and 504. NMOS transistors 503 and 504 are diode-connected transistors, so that they are constantly conducting. PMOS transistors 501 and 502 are controlled by control signals $C_1$ and $C_2$ at terminals 505 and 506. In a data retention test, when both PMOS transistors 501 and 502 are turned off, data retention voltage $V_{dr}$ on power bus 302 is at voltage $V_{cc} - 2*V_t$, where $2*V_t$ is the total voltage drop across NMOS transistors 503 and 504, $V_t$ being the threshold voltage of each of NMOS transistors 503 and 504.

Alternatively, if PMOS transistor 501 is turned off and PMOS transistor 502 is turned on, the data retention voltage $V_{dr}$ at power rail 302 is $V_{cc} - V_t$. If PMOS transistors 501 is turned on, data retention voltage $V_{dr}$ on power rail 302 is $V_{cc}$. Thus, during a data retention test, circuit 500 allows data retention voltage $V_{dr}$ of power bus 302 to be selectable between $V_{cc}$, $V_{cc} - V_t$ and $V_{cc} - 2*V_t$. In one embodiment, during a data retention test, when $V_{cc}$ is taken down to 2.0–2.5 volts, thereby allowing a peripheral logic circuit to operate, memory circuit 307 is provided a supply voltage in the order of 0.5 volts (i.e. 2.0 volts minus two $V_t$'s of 0.7 volts each), typically for 100–500 milliseconds, to stress the memory and to determine whether or not a leakage current path exists in memory circuit 307. Of course, during data retention testing, the techniques shown, for example, in FIGS. 3a, 3b, 4a and 4b (i.e., ratioed devices or currents sources) can also be used to adjust the voltage $V_{dr}$ on power bus 302.

Circuit 500 of FIG. 5 need not be implemented as a power rail for the memory circuit separately externally accessible from a power rail for the logic circuit. In fact, as the memory circuit becomes large, the cumulative currents for the memory circuit can become large, such that multiple $V_{cc}$ lines may be required under the approaches of FIGS. 3a–3c and FIGS. 4a–4b. Such multiple $V_{cc}$ lines cross over each other and other ground lines as a grid above the top metal layer of the integrated circuit.

Figure 1:
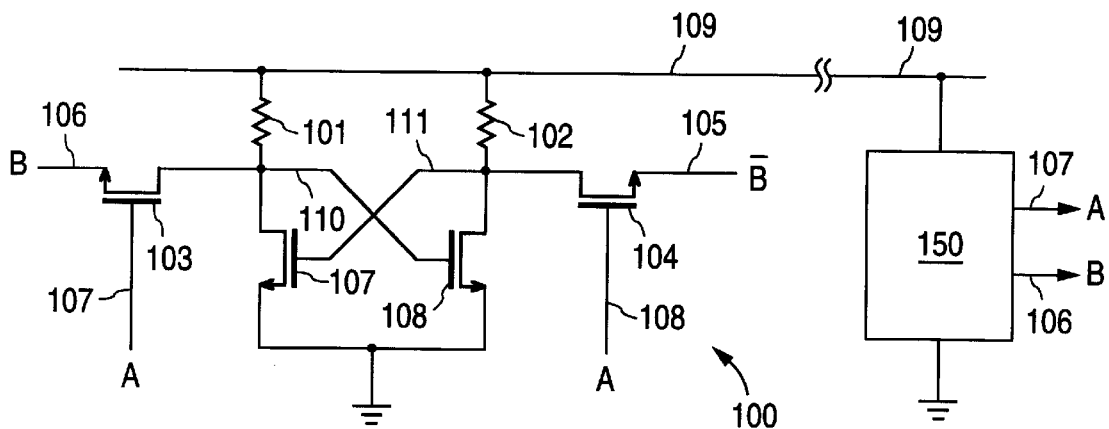
FIG. 1 shows, in the prior art, an SRAM cell 100 sharing a power supply bus with a logic circuit 150.
Figure 6:
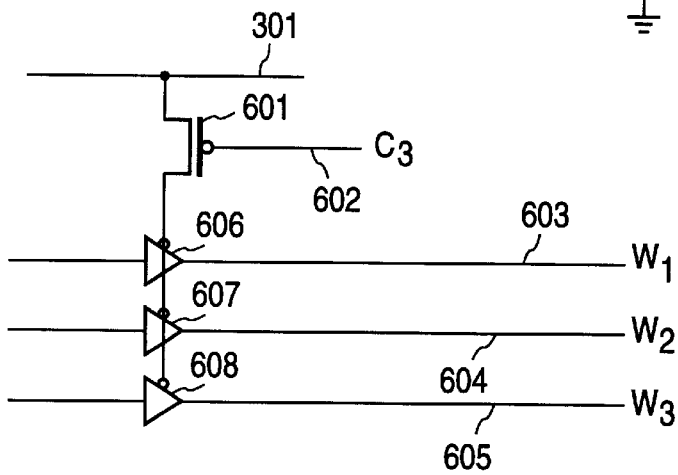
FIG. 6 shows a circuit 600 which provides word line drivers 606–608 to isolate word lines 603–605 prior to the beginning of the data retention test.

During a data retention test, to further avoid inadvertent switching in a logic circuit from inadvertently writing into a memory circuit, circuit 600 of FIG. 6 is provided. FIG. 6 shows a circuit 600 which provides word line drivers 606–608 to isolate word lines 603–605 prior to the beginning of the data retention test. Word line drivers 606–608 are disabled by a control signal $C_3$ at terminal 602. To isolate word lines 603–605, control signal $C_3$ is brought to a logic high voltage, so that word line drivers 606–608 are tristated, thereby ensuring a logic low value for the word lines (e.g. in SRAM cell 100 of FIG. 1, terminals 107 and 108) at the beginning of the data retention test. Thereafter, the memory circuit is brought to $V_{dr}$ and subsequently repowered, the logic circuit is then reset and control signal $C_3$ is brought to a logic low level so as to re-enable word lines 606–608 to be driven.

The above detailed description is provided to illustrate the specific embodiments of the present invention and is not intended to be limiting. Numerous variations and modifications within the present invention are possible. The present invention is defined by the claims appended hereinbelow.

We claim:

1. In an integrated circuit including a logic circuit and a memory circuit, a circuit for applying a data retention test to said memory circuit, comprising:

a first power supply terminal coupled to said memory circuit for providing power to said memory circuit;

a second power supply terminal coupled to receive a power supply voltage external to said integrated circuit;

a first NMOS transistor, having a gate terminal, a source terminal and a drain terminal, said source and drain terminals of said first NMOS transistor being coupled between said first and second power supply terminals, and said gate terminal biased such that said first NMOS transistor is conducting; and a first PMOS transistor, having a gate terminal, a drain terminal and a source terminal, said gate terminal of said PMOS transistor receiving a first control signal, and said drain and source terminals of said PMOS transistor being coupled to said source and drain terminals of said NMOS transistor, respectively, such that when said first control signal is in an asserted state, said PMOS transistor becomes conducting to equalize a voltage across said drain and source terminals of said NMOS transistor.

2. A circuit as in claim 1, further comprising:

a second NMOS transistor having a gate terminal, a drain terminal and a source terminal, said second NMOS transistor being coupled between said first and second power supply terminals and in series with said first NMOS transistor; and a second PMOS transistor having a gate terminal, a drain terminal and a source terminal, said gate terminal receiving a second control signal, said source and drain terminals to said first and second power supply terminals, such that when said second control signal is asserted, said second PMOS transistor becomes conducting to equalize a voltage across said series connected first and second NMOS transistors.

3. A circuit as in claim 1, further comprising a circuit in said integrated circuit for adjusting said voltage on said first power supply terminal to a voltage between said externally received power supply voltage and a ground voltage.

4. A circuit for providing a power supply voltage to a memory circuit during a memory data retention test, comprising:

a first power supply terminal;

a second power supply terminal for providing said power supply voltage;

a plurality of circuit elements coupled to form a current path between said first and second power supply terminals, each circuit element contributing to a predetermined voltage drop when a current flows in said current path; and a shunt device having a control terminal, said shunt device coupled across one or more of said circuit elements, said control terminal receiving a control signal, such that when said control signal is asserted, said shunt device equalizes a voltage across said one or more of said circuit elements.

5. A circuit as in claim 4, further comprising a circuit in said integrated circuit for adjusting said voltage on said second power supply terminal to a voltage between a voltage at said first power supply voltage and a ground voltage.

6. In an integrated circuit including a logic circuit and a memory circuit, a method for applying a data retention test to said memory circuit, comprising the steps of:

coupling a first power supply terminal to said memory circuit, so as to provide power to said memory circuit;

coupling a second power supply terminal to receive a power supply voltage external to said integrated circuit;

providing a first NMOS transistor, said first NMOS transistor having a gate terminal, a source terminal and a drain terminal, said source and drain terminals of said first NMOS transistor being coupled between said first and second power supply terminals, and said gate terminal biased such that said first NMOS transistor is conducting; and providing a first PMOS transistor, said first PMOS transistor having a gate terminal, a drain terminal and a source terminal, said gate terminal of said PMOS transistor receiving a first control signal, and said drain and source terminals of said PMOS transistor being coupled to said source and drain terminals of said NMOS transistor, respectively, such that when said first control signal is in an asserted state, said PMOS transistor becomes conducting to equalize a voltage across said drain and source terminals of said NMOS transistor.

7. A method as in claim 6, further comprising the step of providing a circuit in said integrated circuit for adjusting said voltage on said first power supply terminal to a voltage between said externally received power supply voltage and a ground voltage.

8. A method as in claim 6, further comprising the steps of:

providing a second NMOS transistor having a gate terminal, a drain terminal and a source terminal, said second NMOS transistor being coupled between said first and second power supply terminals and in series with said first NMOS transistor; and providing a second PMOS transistor having a gate terminal, a drain terminal and a source terminal, said gate terminal receiving a second control signal, said source and drain terminals to said first and second power supply terminals, such that when said second control signal is asserted, said second PMOS transistor becomes conducting to equalize a voltage across said series connected first and second NMOS transistors.

9. A method for providing a power supply voltage to a memory circuit during a memory data retention test, comprising the steps of:

providing a first power supply terminal;

providing a second power supply terminal for providing said power supply voltage;

providing a plurality of circuit elements coupled to form a current path between said first and second power supply terminals, each circuit element contributing to a predetermined voltage drop when a current flows in said current path; and providing a shunt device having a control terminal, said shunt device being coupled across one or more of said circuit elements, said control terminal receiving a control signal, such that when said control signal is asserted, said shunt device equalizes a voltage across said one or more of said circuit elements.

10. A method as in claim 9, further comprising a circuit in said integrated circuit for adjusting said voltage on said second power supply terminal to a voltage between a voltage at said first power supply voltage and a ground voltage.

* * * * *